United States Patent [19]
Darthenay et al.

[11] Patent Number: 5,923,213
[45] Date of Patent: Jul. 13, 1999

[54] DIGITALLY GAIN-CONTROLLED AMPLIFYING DEVICE, AND CAMERA USING SUCH A DEVICE

[75] Inventors: Frëdëric Darthenay, St. Aubin/Mer; Richard Morisson, Caen; Denis Raoulx, Paris, all of France

[73] Assignee: U.S. Philips Corporation, New York, N.Y.

[21] Appl. No.: 08/890,450

[22] Filed: Jul. 9, 1997

[51] Int. Cl.[6] .............................. H03F 1/14; H03F 3/68
[52] U.S. Cl. .................... 330/51; 330/124 R; 330/129; 396/99
[58] Field of Search .................... 330/51, 124 R, 330/129, 278, 279, 295, 308; 396/99

[56] References Cited

U.S. PATENT DOCUMENTS 4,598,252  7/1986  Andricos ............................. 330/51
4,791,446  12/1988  Ishida et al. ....................... 396/100 X

*Primary Examiner*—Steven J. Mottola
*Attorney, Agent, or Firm*—Gregory L. Thorne

[57] ABSTRACT

An amplifying device has a decibel gain that evolves quasi-linearly as a function of the digital value of a control word C(0:M−1). The device includes: an amplifying stage with K amplifiers having mutually different decibel gains, the gain in decibels of each amplifier being a multiple of the same value G0; a switching stage with K switches; a gain-controlled amplifier having a gain which varies between 0 and G0 as a function of the value of the N least significant bits (C(0:N−1)) of the control word received at its digital input; and a decoder receiving a digital word including the (M−N) most significant bits (C(N:M−1)) of the control word. The decoder has K logic outputs controlling the K switches.

5 Claims, 2 Drawing Sheets

DIGITALLY GAIN-CONTROLLED AMPLIFYING DEVICE, AND CAMERA USING SUCH A DEVICE

FIELD OF THE INVENTION

The invention relates to the field of amplifiers and more specifically to the field of gain-controlled amplifying devices having an analog input for receiving an analog input voltage, a digital input for receiving a word of M bits, referred to as control word, for controlling the gain of the device, and an analog output for supplying an analog output voltage.

BACKGROUND OF THE INVENTION

In certain applications, it is desirable to vary the decibel gain of such a device in a linear manner as a function of the digital value of the control word. The majority of devices realizing such a function submit the digital control word to a conversion, in order to transform it into an analog control voltage whose variation as a function of the digital value of the control word, combined with a transfer function adapted to the amplifying device, leads to a quasi-linear variation of the decibel gain of the device. This conversion system often proves to be complex and leads to large-size circuits. Moreover, the error produced during conversion of the digital word turns out to be multiplied during the actual amplification. Lastly, because of its analog nature, the control voltage has a certain noise which also turns out to be multiplied during the amplification. Consequently, the higher the gain of the amplifying device, the larger the error with respect to the nominal linear gain.

SUMMARY OF THE INVENTION

It is an object of the invention to remedy these drawbacks by providing an amplifier in which the control word acts largely directly on the result of the amplification of the analog input voltage.

To this end, an amplifying device according to the invention is characterized in that it includes:

an amplifying stage having an input constituting the analog input of the device, and K outputs, comprising K amplifiers, each amplifier having an input connected to the input of the stage and an output constituting one of the K outputs of the stage, the amplifiers having mutually different decibel gains, the decibel gain of each amplifier being a multiple of a value referred to as G0 and, a selection stage having K logic inputs, provided with means for activating one of the K outputs of the amplifying stage and for deactivating the other outputs as a function of the signals received at the K logic inputs. The device also includes a gain-controlled amplifier having an analog input receiving that of the K outputs of the amplifying stage which is activated by the selection stage, a digital input receiving a digital word constituted by the N least significant bits of the control word, and an analog output constituting the analog output of the device, the gain of said amplifier varying as a function of the value of the word received at its digital input.

In such a device, a large part of the amplification directly takes place in the amplifying stage and independently of the control word. The selection stage allows direct selection of that output of the amplifying stage which must be activated. The gain in decibels of the amplifying stage evolves in a perfectly linear manner as a function of the (M−N) most significant bits of the control word. The N least significant bits of the control word allow a refinement of the value of the total gain of the device. If the gain-controlled amplifier has a decibel gain which does not evolve linearly as a function of the value of the word received at its digital input, then this error will be limited by the low maximum gain which this amplifier will provide. It will thus introduce a minimized error with respect to the nominal linear gain in the total gain of the device. Moreover, since the difference with respect to the linearity is solely due to the gain-controlled amplifier, it will be completely independent of the total value of the gain and will thus not increase when this gain increases. On the contrary, the relative difference will actually decrease.

An embodiment of the invention provides a gain-controlled amplifying device having an analog input for receiving an analog input voltage, a digital input for receiving a word of M bits, referred to as control word, for controlling the gain of the device, and an analog output for supplying an analog output voltage. The embodiment includes an amplifying stage having an input constituting the analog input of the device, and K outputs, and comprising K amplifiers, each amplifier having an input connected to the input of the stage and an output constituting one of the K outputs of the stage, the amplifiers having mutually different decibel gains, the decibel gain of each amplifier being a multiple of a value referred to as G0. The embodiment also includes a switching stage having K analog inputs connected to K outputs of the amplifying stage, an analog output and K logic inputs, said stage comprising K switches each controlled by a signal received at one of the K logic inputs, all switches having a terminal connected in common, thus constituting the analog output of the stage, the other terminals of the switches constituting the K analog inputs of the stage. The embodiment also has A gain-controlled amplifier having an analog input connected to the analog output of the switching stage, a digital input receiving a digital word constituted by the N least significant bits of the control word, and an analog output constituting the analog output of the device, said amplifier having a gain which varies as a function of the value of the word received at its digital input. Finally the gain controlled amplifying device includes a decoder having a digital input of (M−N) bits receiving a digital word constituted by the (M−N) most significant bits of the control word, said decoder having K logic outputs connected to the K logic inputs of the switching stage, one of said logic outputs being put in an active state, the position of said logic output being a function of the value of the word received at the digital input of the decoder.

a variant of the invention provides a gain-controlled amplifying device as described above, which is characterized in that the values of the decibel gains of the amplifiers of the amplifying stage are successive multiples of G0, and in that the decibel gain of the gain-controlled amplifier varies between zero and G0. In this variant the difference between the decibel gains of the amplifiers of the amplifying stage is thus reduced, which reduces the error introduced by the gain-controlled amplifier.

An advantageous embodiment of the invention provides an amplifying device as described above, which is characterized in that, in considering the amplifiers of the amplifying stage in an order corresponding to that of increasing gains, the output of the amplifier having the smallest gain is connected to that of the switches of the switching stage which is controlled by the logic output controlled by the least significant bits received at the digital input of the decoder, the successive outputs of the other amplifiers being connected, respectively, to those outputs of the switches of the switching stage which are controlled in an ascending order as a function of the increase of the value of the control word.

Such a device facilitates the direct selection, by means of the K outputs of the decoder, of that output of the amplifying stage which must be activated. The structure of the decoder is thereby simplified.

The invention also relates to a camera. An embodiment of the camera invention includes

- a device for detecting light and converting the light into analog electronic signals, and
- an amplifying device having an analog signal input intended to receive said analog electronic signals, a digital input intended to receive a digital word, referred to as control word, for controlling the gain of the amplifying device, and an analog signal output. The camera embodiment also includes
- an A/D converter having an analog input connected to the output of the amplifier, and a digital output, and
- a digital processing unit having an input connected to the output of the A/D converter, which unit is intended to apply the control word to the amplifying device, Finally the camera includes the amplifying device is as described above.

FIG. 1 is a diagram partially illustrating an amplifying device in accordance with an embodiment of the invention, FIG. 2 is a characteristic curve representing the evolution of the gain in decibels of an amplifying device according to the invention, as a function of the digital value of the control word, and FIG. 3 is a diagram partially illustrating a camera using a gain-controlled amplifier according to the invention.

DETAILED DESCRIPTION OF PREFERRED EMBODIMENTS

Figure 1:
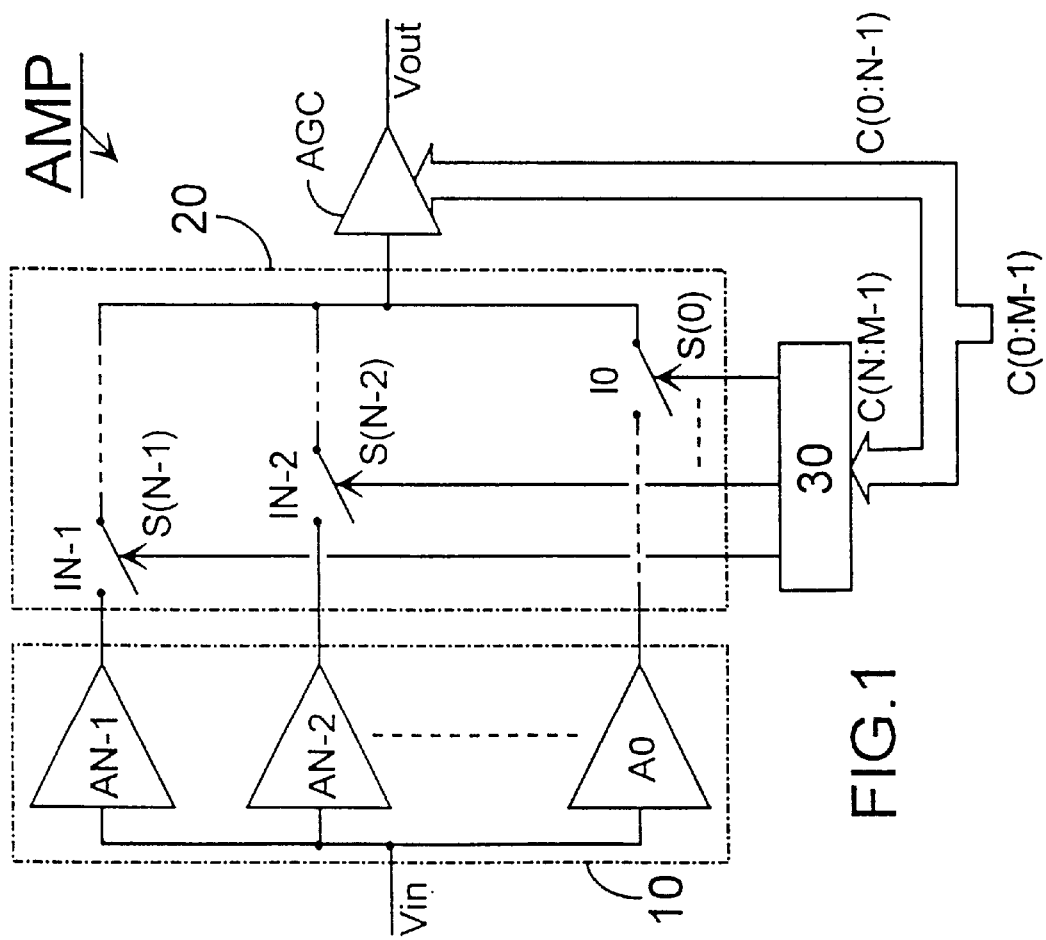

As is shown in FIG. 1, an amplifying device AMP according to the invention has an analog input for receiving an analog input voltage Vin, a digital input for receiving a word of M bits C(O:M−1), referred to as control word, for controlling the gain of the device, and an analog output for supplying an analog output voltage Vout. The device includes

- an amplifying stage 10 having an input constituting the analog input of the device, and K outputs, and comprising K amplifiers A0, ..., Ak−1, each amplifier Ai (for i=1 to k−1) having an input connected to the input of the stage and an output constituting one of the K outputs of the stage, the amplifiers A0, ..., Ak−1 having mutually different decibel gains, the decibel gains Gi (for i=0 to k−1) of the amplifiers Ai being successive multiples of a value referred to as G0. The device also includes
- a switching stage 20 having K analog inputs connected to the K outputs of the amplifying stage, an analog output and K logic inputs, said stage comprising K switches I0, ..., Ik−1 each controlled by a signal received at one of the K logic inputs, all switches I0, ..., Ik−1 having a terminal connected in common, thus constituting the analog output of the state, the other terminals of the switches I0, ..., Ik−1 constituting the K analog inputs of the stage. Finally the device includes
- a gain-controlled amplifier AGC having an analog input connected to the analog output of the switching stage 20, a digital input receiving a digital word constituted by the N least significant bits C(O:N−1) of the control word C(O:M−1), and an analog output constituting the analog output of the device, said amplifier AGC having a gain which varies between 0 and G0 as a function of the value of the word C(O:N−1) received at its digital input. Finally the device includes
- a decoder 30 having a digital input of (M−N) bits receiving a digital word constituted by the (M−N) most significant bits C(N:M−1) of the control word C(O:M−1), said decoder 30 having K logic outputs S(O:K−1) connected to the K logic inputs of the switching stage 20, one of said logic outputs S(O:K−1) being put in an active state, the position of said logic output being a function of the value of the word C(N:M−1) received at the digital input of the decoder 30.

In this embodiment, the output of the amplifier Ai (for i=0 to K−1) is connected to the switch Ii which is controlled by the output S(i) of the decoder.

Figure 2:
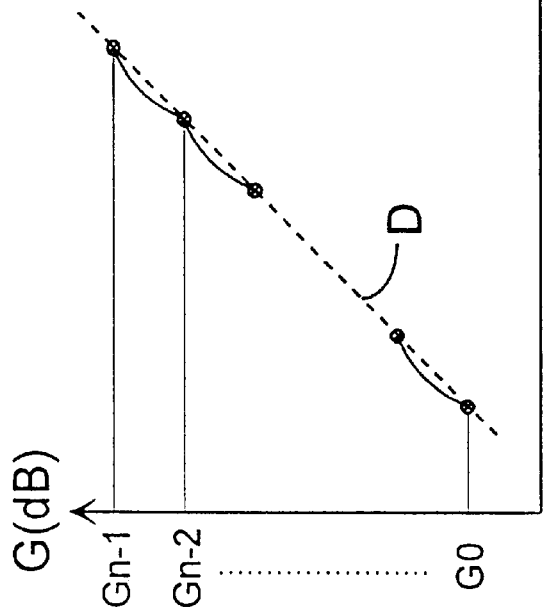

FIG. 2 shows a characteristic curve illustrating the evolution of the gain in decibels G(dB) defined by the relation G(dB)=20.log(Vout/Vin) of an amplifying device according to the invention, as a function of the digital value CODE of the control word C(O:M−1). The straight line D represents a nominal characteristic curve, i.e. a gain in decibels evolving perfectly linearly as a function of the digital value CODE of the control word C(O:M−1). The points representing the gains Gi of each amplifier Ai (for I=0 to K−1) are distributed on the nominal straight line D, which illustrates the linearity of the evolution of the gain of the amplifying stage as a function of the (M−N) most significant bits of the control word C(O:M−1). The periodical differences found between two successive values (Gi, Gi+1) with respect to the nominal straight line D, which have been intentionally exaggerated on this drawing, illustrate a linearity fault of the decibel gain G(dB) of the gain-controlled amplifier AGC. They particularly show that the error produced by this linearity fault is independent of the total gain of the device. It only depends on the intrinsic properties of the gain-controlled amplifier AGC. The maximum error may be computed if the transfer characteristic of said amplifier AGC is known. If, for example, this characteristic is of the type:

$$G=1+C/2^{N+1}, \text{ (where } C=0, \ldots, 2^{N+1}), \text{ and } G\phi=6 \text{ dB},$$

the error is given by:

$$ERR=[20.\text{Log }(1+C/2^{N+1})]-[6.C/2^{N+1})]$$

Thus:

$$d\text{ERR}/dC=[(20/\ln 10).(\tfrac{1}{2}^{N+1}).(1/(1+C/2^{N+1}))]-\tfrac{6}{2}^{N+1}$$

or:

$$d\text{ERR}/dC=(20.2^{N+1}-6.\ln 10.2^{N+1}-6.\ln 10.C)/(\text{denominator}),$$

in which the value of the denominator is not important for computing the maximum error. There is a maximum error at:

$$C=2^{N+1}.[(20/(6.\ln 10))-1]=0.44.2^{N+1}$$

By substituting this value in the equation giving the error ERR, the maximum error is obtained:

ERRmax=0.5 dB

In an amplifier in which the value of G0 is, as in this example, 6 dB, this error is at worst less than 10% of the total gain of the device when it is at its minimum value G0 and will be rapidly negligible as the total gain increases.

Figure 3:
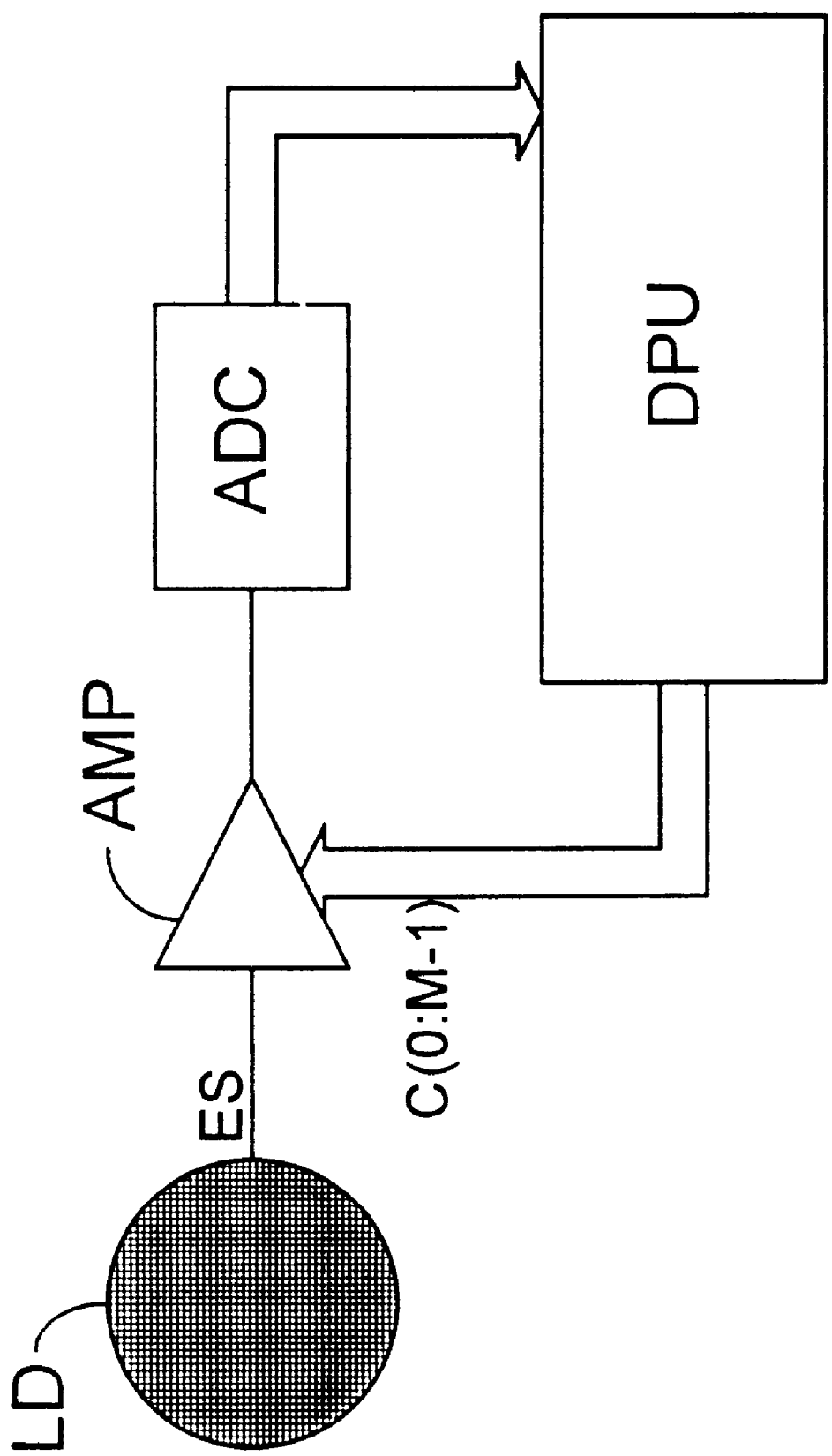

FIG. 3 is a diagram partially illustrating a camera comprising a gain-controlled amplifier according to the invention. Such a camera has:

a device LD for detecting light and converting the light into analog electronic signals ES, and an amplifying device AMP as described above, having an analog signal input receiving said analog electronic signals ES, a digital input receiving a digital word C(0:M−1) referred to as control word, for controlling the gain of the amplifying device AMP, and an analog signal output. The camera also has an A/D converter ADC having an analog input connected to the output of the amplifier AGC, and a digital output, and a digital processing unit DPU having an input connected to the output of the A/D converter ADC, which unit applies the control word C(0:M−1) to the amplifying device AMP.

The invention has been disclosed with reference to specific preferred embodiments, to enable those skilled in the art to make and use the invention, and to describe the best mode contemplated for carrying out the invention. Those skilled in the art may modify or add to these embodiments or provide other embodiments without departing from the spirit of the invention. Thus, the scope of the invention is only limited by the following claims:

We claim:

1. A gain-controlled amplifying device comprising:
an analog input for receiving an analog input voltage;
a digital input for receiving a control word of M bits, for controlling the gain of the device;
an analog output for supplying an analog output voltage;
an amplifying stage having: an input including the analog input; K outputs; and K amplifiers, each amplifier having an input connected to the input of the stage and an output to one of the K outputs of the stage, the amplifiers having mutually different decibel gains, the decibel gain of each amplifier being a multiple of the same value;
a selection stage having K logic inputs and means for activating one of the K outputs of the amplifying stage and for deactivating the other such outputs as a function of the signals received at the K logic inputs; and
a gain-controlled amplifier having an analog input communicating with the K outputs of the amplifying stage which is activated by the selection stage, a digital input receiving a digital word including N least significant bits of the control word, and an analog output including the analog output of the device; and
wherein the gain of the gain-controlled amplifier varies as a function of the value of the control word received at its digital input.

2. A gain-controlled amplifying device comprising:
an analog input for receiving an analog input voltage;
a digital input for receiving a control word of M bits, for controlling the gain of the device;
an analog output for supplying an analog output voltage;
an amplifying stage having: an input including the analog input of the device; K outputs; and K amplifiers, each amplifier having an input connected to the input of the stage and an output connected to one of the K outputs of the stage, the amplifiers having mutually different decibel gains, the decibel gain of each amplifier being a multiple of the same value;
a switching stage having: K analog inputs connected to K outputs of the amplifying stage; an analog output; K logic inputs; and K switches, each controlled by a signal received at one of the K logic inputs, all switches having a terminal connected in common, to the analog output of the stage, the other terminals of the switches constituting the K analog inputs of the stage; and
a gain-controlled amplifier having an analog input connected to the analog output of the switching stage, a digital input for receiving the N least significant bits of the control word, and an analog output connected to the analog output of the device, said amplifier having a gain which varies as a function of the value of the word received at its digital input; and
a decoder having a digital input of (M−N) bits for receiving a digital word including the (M−N) most significant bits of the control word, said decoder having K logic outputs connected to the K logic inputs of the switching stage, one of said logic outputs being put in an active state depending on the value of the digital word received at the digital input of the decoder.

3. A gain-controlled amplifying device as claimed in claim 1, wherein the values of the decibel gains of the amplifiers of the amplifying stage are successive multiples of G0, and in that the decibel gain of the gain-controlled amplifier varies between zero and G0.

4. A gain-controlled amplifying device as claimed in claim 1 wherein, in considering the amplifiers of the amplifying stage in an order corresponding to that of increasing gains, the output of the amplifier having the smallest gain is connected to that of the switches of the switching stage which is controlled by the logic output controlled by the least significant bits received at the digital input of the decoder, the successive outputs of the other amplifiers being connected, respectively, to those outputs of the switches of the switching stage which are controlled in an ascending order as a function of the increase of the value of the control word.

5. A camera comprising:
a device for detecting light and converting the light into analog electronic signals;
an amplifying device including: an analog signal input to receive said analog electronic signals; a digital input to receive a digital control word, for controlling the gain of the amplifying device and an analog signal output;
an A/D converter having an analog input connected to the output of the amplifying device, and a digital output; and
a digital processing unit having an input connected to the output of the A/D converter, to apply the control word to the amplifying device; and
wherein the amplifying device further includes:
an amplifying stage having: an input including the analog input; K outputs; and K amplifiers, each amplifier having an input connected to the input of the stage and an output to one of the K outputs of the stage, the amplifiers having mutually different decibel gains, the decibel gain of each amplifier being a multiple of the same value;

a selection stage having K logic inputs and means for activating one of the K outputs of the amplifying stage and for deactivating the other such outputs as a function of the signals received at the K logic inputs; and a gain-controlled amplifier having an analog input communicating with the K outputs of the amplifying stage which is activated by the selection stage, a digital input receiving a digital word including N least significant bits of the control word, and an analog output including the analog output of the device; and wherein the gain of the gain-controlled amplifier varies as a function of the value of the control word received at its digital input.

* * * * *